United States Patent [19]

Fujita et al.

[11] Patent Number: 5,057,201
[45] Date of Patent: Oct. 15, 1991

[54] PROCESS FOR DEPOSITING A SUPERCONDUCTING THIN FILM

[75] Inventors: Nobuhiko Fujita; Naoji Fujimori; Hideo Itozaki; Saburo Tanaka; Keizo Harada; Tetsuji Jodai, all of Hyogo, Japan

[73] Assignee: Sumitomo Electric Industries, Ltd., Osaka, Japan

[21] Appl. No.: 462,983

[22] Filed: Jan. 10, 1990

Related U.S. Application Data

[63] Continuation-in-part of Ser. No. 167,895, Mar. 14, 1988, abandoned.

[30] Foreign Application Priority Data

Mar. 14, 1987 [JP] Japan .................................. 62-59214
Mar. 16, 1987 [JP] Japan .................................. 62-60317
Mar. 18, 1987 [JP] Japan .................................. 62-63203
Mar. 18, 1987 [JP] Japan .................................. 62-63204
Mar. 18, 1987 [JP] Japan .................................. 62-63205
Mar. 18, 1987 [JP] Japan .................................. 62-63206

[51] Int. Cl.$^5$ .................................................. C23C 14/00
[52] U.S. Cl. ............................ 204/192.24; 204/192.11; 204/192.31; 427/62; 505/1; 505/816; 505/818; 505/819
[58] Field of Search .............. 204/192.24, 192.31, 204/192.11; 427/62; 505/816, 818, 819, 1

[56] References Cited

U.S. PATENT DOCUMENTS

| | | | |
|---|---|---|---|
| 3,914,389 | 10/1975 | Haacke | 423/263 |
| 3,932,315 | 1/1976 | Sleight | 252/521 |
| 4,107,163 | 8/1978 | Donohue | 423/263 |
| 4,866,032 | 9/1989 | Fujimori et al. | 204/192.11 |
| 4,892,862 | 1/1990 | Ogushi et al. | 204/192.24 |

FOREIGN PATENT DOCUMENTS 284489 9/1988 European Pat. Off. .
109824 8/1981 Japan .
96599 5/1985 Japan .

OTHER PUBLICATIONS

Bednorz et al., "Possible High $T_c$ Super-Conductivity in the Ba-La-Cu-O System", Z. Phys. B-Condensed Matter, 64 (1986), pp. 189-193.
Kawasaki et al., "High $T_c$ Yb-Ba-Cu-O Thin Films Deposited on Sintered YSZ Substrates by Sputtering", Jap. J. Applied Phys., 26(5), 1738-1740 (May 1987).

Primary Examiner—John F. Niebling
Assistant Examiner—Steven P. Marquis
Attorney, Agent, or Firm—Foley & Lardner

[57] ABSTRACT

This invention relates to a process for producing a superconducting thin film, characterized in that a target made of a compound oxide containing Ba; one element M selected from a group consisting of Y, La, Gd, Ho Er and Yb; and Cu is used for carrying out physical vapor deposition to produce a thin film of perovskite type oxide or quasi-perovskite type oxide. The target may be made of preliminary sintered material which is obtained by preliminary sintering of a powder mixture including oxides, carbonates, nitrates or sulfates of Ba; one element M selected from a group consisting of Y, La, Gd, Ho Er and Yb; and Cu, or of finally sintered material which is obtained by a final sintering of preliminary sintered material at a temperature ranging from 700° to 1,500° C., preferably from 700° to 1,300° C. The physical vapor deposition is performed by high-frequency sputtering technique under Ar and $O_2$ containing atmosphere, at a partial pressure of Ar ranging from $1.0 \times 10^{-3}$ to $1 \times 10^{-1}$ Torr, preferably $5.0 \times 10^{-3}$ to $1 \times 10^{-1}$ Torr and at a partial pressure of $O_2$ ranging from $0.5 \times 10^{-3}$ to $1 \times 10^{-1}$ Torr, preferably $1.0 \times 10^{-3}$ to $1 \times 10^{-1}$ Torr. The obtained thin film may be further heat-treated at a temperature ranging from 250° C. to 1,700° C., preferably from 250° C. to 1,200° C.

49 Claims, 2 Drawing Sheets

PROCESS FOR DEPOSITING A SUPERCONDUCTING THIN FILM

This application is a continuation-in-part of application Ser. No. 07/167,895, filed March 14, 1988, now abandoned.

BACKGROUND OF THE INVENTION

1. Field of the Invention

The present invention relates to a process for preparing a thin film of superconductor. More particularly, it relates to a process for depositing on a substrate a superconducting thin film of a compound oxide which is uniform in composition and has a higher transition temperature of superconductivity.

2. Description of the Related Art

Superconductivity is a phenomenon which is understood as a phenomenon of phase change under which the electrical resistance become zero and perfect diamagnetism is observed. Thus, under the superconducting condition, electric current of a very high current density can be delivered without any loss of power.

Therefore, if a superconducting power cable is realized, the power loss of the order of 7% which is inevitable in conventional power cables can be reduced greatly. Realization of superconducting coils for generating a very high magnetic field is expected to accelerate development in the field of fusion power generation in which electric power is consumed beyond the amounts used under the present technology, as well as in the field of MHD power generation or motor-generators. The development of superconductivity is demanded also in other industrial fields such as in the field or electric power generation; in the field of transportation, for example magnetic levitation trains, or magnetically propelled ships; in the medical field such as in high-energy beam radiation units; or in the field of science such as NMR or high-energy physics.

In addition to the abovementioned electric power applications, superconducting materials can be used in the field of electronics, for example, as a device using the Josephson effect in which quantum efficiency is observed macroscopically when an electric current is passed through a weak junction arranged between two superconducting bodies. Tunnel junction type Josephson devices, which are a typical application of the Josephson effect, are expected to be a high-speed and low-power consuming switching devices owing to the smaller energy gap of the superconducting material. It is also expected that the Josephson device will be utilized as high sensitivity sensors or detectors for sensing very weak magnetic fields, microwaves, radiant rays, or the like since variation of electromagnetic waves or magnetic fields is reflected in variation of the Josephson effect and can be precisely observed as a quantum phenomenon. Development of the superconducting devices is also demanded in the field of high-speed computers in which the power consumption per unit area is reaching the upper limit of the cooling capacity with increment of the integration density in order to reduce energy consumption.

However, their actual usage has been restricted because the phenomenon of superconductivity can be observed only at very low cryogenic temperatures. Among known superconducting materials, a group of materials having so-called A-15 structure show rather higher Tc (critical temperature of superconductivity) than others, but even the top record of Tc in the case of $Nb_3Ge$ which showed the highest Tc could not exceed 23.2 K at most. This means that liquefied helium (boiling point of 4.2 K) is the only cryogen which can realize such very low temperature of Tc. However, helium is not only a limited costly resource but also require a large-scaled system for liquefaction. Therefore, there had been a strong desire for other superconducting materials having higher Tc. But no material which exceeded the abovementioned Tc had been found in all studies for the past ten years.

The possibility of the existence of a new type of superconducting materials having much higher Tc was revealed by Bednorz and Muller who discovered a new oxide type superconductor in 1986 [Z. Phys. B64 (1986) 189]

This new oxide type superconducting material is $[La, Ba]_2CuO_4$ or $[La, Sr]_2CuO_4$ which is called the $K_2NiF_4$-type oxide. The $K_2NiF_4$-type oxides show higher Tc as 30 to 50K which are extremely higher than the known superconducting materials and hence it becomes possible to use liquified hydrogen (b.p. $=20.4K$) or liquified neon (b.p. $=27.3K$) as a cryogen to bring them to exhibit the superconductivity.

However, the above mentioned new type superconducting materials which were just discovered have been studied and developed only in the form of sintered bodies or as a bulk produced from powders. The superconducting sintered bodies having a a bulk form inevitably contain non-reacted particles and hence are not uniform in composition and in structure, so that they can not be used for manufacturing electronics devices.

When the superconducting material is applied to a variety of electronics devices, it is indispensable to prepare a thin film of superconducting material. The superconducting thin film, however, can not be obtained if composition and structure of the thin film is not controlled precisely.

It is also expected to utilize the superconducting material to produce a superconducting elongated article comprising a supporting member made of metal or the like in a form of wire, strand, band, tape or the like and a superconducting thin film vacuum-deposited on the supporting member. In this case also, it is necessary to establish technology how to deposit the superconducting thin film in vacuum.

The vapor deposition technique has been used for producing a thin film of superconducting material such as $Nb_3Ge$ and $BaPb_{1-x}Bi_xO_3$. In case of a thin film of $Nb_3Ge$, particles of Nb and Ge are sputtered from several targets consisting of Nb and Ge, respectively, and are deposited onto a substrate to form a film composed of $Nb_3Ge$. Japanese patent laid-open No. 56-109,824 discloses a process for producing a thin film of $BaPb_{1-x}Bi_xO_3$. by means of sputtering technique. But, no prior art has disclosed detailed conditions of physical deposition of the new type compound oxides. The present invention was completed after a variety of experiments and examinations which were done in order to overcome the abovementioned problem.

Therefore, an object of the present invention is to provide a process for producing a superconducting thin film which is uniform in composition and structure and has the higher critical temperature.

SUMMARY OF THE INVENTION

The present invention provide a process for producing a superconducting thin film, characterized in that a target used for carrying out physical vapor deposition is made of a compound oxide containing Ba; one element M selected from a group consisting of Y, La, Gd, Ho Er and Yb; and Cu to produce a thin film of perovskite type oxide or quasi-perovskite type oxide.

The physical vapor deposition includes sputtering, ion plating, vacuum deposition, ion beam deposition and molecular beam deposition, but sputtering is most preferable.

More particularly, the present invention provides a process for producing a superconducting thin film on a substrate comprising the steps of providing a substrate and depositing a thin superconducting film on the substrate by high-frequency sputtering using a target made of a compound oxide containing Ba, one element M selected from the group consisting of Y, La, Gd, Ho, Er, and Yb; and Cu, wherein the substrate is heated to a temperature in the range of 450° C. to 1,000° C. during sputtering.

The target preferably contains perovskite type oxide or quasi-perovskite type oxide. The term quasi-perovskite type oxide means a structure which can be considered to have such a crystal structure that is similar to Perovskite-type oxides and includes an orthorhombically distorted perovskite or a distorted oxygen-deficient perovskite or the like.

According to one preferred embodiment of the present invention, the target may be a preliminary sintered mass which is obtained by sintering a powder mixture of an oxide, carbonate, nitrate or sulfate of Ba; an oxide, carbonate, nitrate or sulfate of one element M selected from a group consisting of Y, La, Gd, Ho Er and Yb; and an oxide, carbonate, nitrate or sulfate of Cu, at a temperature ranging from 250° to 1,200° C., preferably 250° to 1,100° C. It is more preferable that the target is made of a finally sintered mass which is obtained by further sintering the abovementioned preliminary sintered material or mass at a temperature ranging from 700° to 1,500° C., preferably from 700° to 1,300° C.

The term preliminary sintering means that powder material is subjected to heat-treatment or calicinated or sintered to produce a compound oxide.

The target can be in a form of powder as well as in a form of a block or mass.

The target may be composed of a plurality of target segments, for example, three target segments consisting of oxide of Ba, oxide of M, and oxide of Cu. Hereinafter, "M" stands for one element selected from a group consisting of Y, La, Gd, Ho, Er, and Yb. It is also possible to use two target segments, for example, consisting of $(Ba, M)O_x$ and CuO, wherein "x" represents a number such that $1 \leq x$.

According to another aspect of the present invention, the atomic ratio of $Cu/(Ba+M)$ in the target is selected in the range of from 0.5 to 0.7 and an atom ratio of $Ba/(Ba+M)$ in the target is preferably within a range of from 0.04 to 0.97, preferably from 0.1 to 0.7. The atomic ratio of Ba, M, and Cu is determined on the basis of the atom ratio of Ba, M, and Cu in the desired thin film to be produced. For example, the atomic ratio can be adjusted as the function of evaporation rates of Ba, M and Cu on the basis of the atomic ratio of Ba, M and Cu in the thin film to be produced. More precisely, the atomic ratio of $Ba/(Ba+M)$ in the target is preferably selected from the following ranges for respective elements M:

| Element "M" | Atom ratio | |
| --- | --- | --- |
| | General range | Preferable range |
| $Ba/(Ba + Y)$ | 0.05–0.95 | 0.2–0.6 |
| $Ba/(Ba + La)$ | 0.04–0.96 | 0.1–0.4 |
| $Ba/(Ba + Gd)$ | 0.04–0.97 | 0.5–0.7 |
| $Ba/(Ba + Ho)$ | 0.05–0.96 | 0.5–0.6 |
| $Ba/(Ba + Er)$ | 0.04–0.95 | 0.3–0.5 |
| $Ba/(Ba + Yb)$ | 0.05–0.96 | 0.5–0.6 |

When the abovementioned atomic ratios $Ba/(Ba+M)$ are 0.04 or less or greater than 0.97, the resulting deposited films do not exhibit desired critical temperatures of superconductivity. The atomic ratio of Ba, M and Cu in the target is preferably determined on the basis of the atomic ratio of Ba, M and Cu in a thin film to be produced in consideration of the evaporation rates of Ba, M and Cu, because the evaporation rates of Ba, M, and Cu are not identical and because melting points of respective oxides of Ba, M, and Cu which are constituents of the thin film are not identical. In other words, if the atomic ratio Ba, M, and Cu in the target is not selected properly, the thin film obtained does not have a desired composition which exhibits superconductivity. In the case of the sputtering technique, the atomic ratio in the target may be determined on the basis of sputtering coefficients of oxides of the respective elements.

According to another preferred embodiment of the present invention, a substrate on which the thin film is deposited is preferably heated by a heater at a temperature ranging from 184° C. to 1,520° C., preferably 184° C. to 1,000° C. during the sputtering operation. It is particularly preferred that the substrate temperature during sputtering be in the range of 450° C. to 1,000° C., and more preferably in the range of 500° C. to 960° C. If the substrate temperature exceeds 500° C. during deposition of the film, annealing can be omitted entirely. The temperature at which the substrate is heated is preferably selected from the following ranges for respective systems:

| Element "M" | Temperature of a substrate | |
| --- | --- | --- |
| | General range (°C.) | Preferable range (°C.) |
| Y type | 450–990 | 500–800 |
| La type | 450–980 | 601–810 |
| Gd type | 451–995 | 546–800 |
| Ho type | 452–990 | 576–800 |
| Er type | 450–1,000 | 596–820 |
| Yb type | 450–985 | 586–800 |

The substrate may be made of a material selected from the group consisting of glass, quartz, silicon, stainless steel and ceramics such as MgO, $BaTiO_3$, sapphire, YSZ, or the like.

According to another preferred embodiment of the present invention, the atmosphere contains Ar and $O_2$. The partial pressure of Ar is preferably adjusted to a range of from $1.0 \times 10^{-3}$ to $1 \times 10^{-1}$ Torr, preferably $5.0 \times 10^{-3}$ to $1 \times 10^{-1}$ Torr, while the partial pressure of $O_2$ is preferably adjusted to a range of from $0.5 \times 10^{-3}$ to $1 \times 10^{-1}$ Torr, preferably $1.0 \times 10^{-3}$ to $1 \times 10^{-1}$ Torr. When the partial pressure of Ar is less than $1.0 \times 10^{-3}$, the deposition rate becomes too slow to produce the thin film in an industrial scale. When the partial pressure of Ar exceeds $1 \times 10^{-1}$ Torr, glow discharge occurs, so that deposition of oxides which exhibit a desired superconducting property cannot be obtained. If the partial pressure of $O_2$ is not higher than $0.5 \times 10^{-3}$, the resulting thin film does not contain a satisfactory amount of perovskite type oxide or quasi-perovskite type oxide because of poor crystal structure. When the partial pressure of $O_2$ exceeds $1 \times 10_{-1}$ Torr, the deposition rate becomes too slow to produce the thin film in an industrial scale. The partial pressures of Ar and $O_2$ are preferably selected from the following ranges for respective systems:

| Element "M" | The partial pressure of Ar (Torr) | |
|---|---|---|
| | General range | Preferable range |
| Y type | $1.0 \times 10^{-3} - 1 \times 10^{-1}$ | $5.0 \times 10^{-3} - 1 \times 10^{-1}$ |
| La type | $2.0 \times 10^{-3} - 9 \times 10^{-2}$ | $6.0 \times 10^{-3} - 9 \times 10^{-2}$ |
| Gd type | $1.0 \times 10^{-3} - 2 \times 10^{-1}$ | $5.0 \times 10^{-3} - 2 \times 10^{-1}$ |
| Ho type | $1.0 \times 10^{-3} - 3 \times 10^{-1}$ | $5.0 \times 10^{-3} - 3 \times 10^{-1}$ |
| Er type | $1.2 \times 10^{-3} - 1 \times 10^{-1}$ | $5.4 \times 10^{-3} - 1 \times 10^{-1}$ |
| Yb type | $1.2 \times 10^{-3} - 1 \times 10^{-1}$ | $5.4 \times 10^{-3} - 1 \times 10^{-1}$ |

| Element "M" | The partial pressure of $O_2$ (Torr) | |
|---|---|---|
| | General range | Preferable range |
| Y type | $0.7 \times 10^{-3} - 8 \times 10^{-2}$ | $1.0 \times 10^{-3} - 8 \times 10^{-2}$ |
| La type | $1.0 \times 10^{-3} - 9 \times 10^{-2}$ | $1.1 \times 10^{-3} - 9 \times 10^{-2}$ |
| Gd type | $0.9 \times 10^{-3} - 3 \times 10^{-1}$ | $1.1 \times 10^{-3} - 3 \times 10^{-1}$ |
| Ho type | $0.8 \times 10^{-3} - 2 \times 10^{-1}$ | $1.0 \times 10^{-3} - 2 \times 10^{-1}$ |
| Er type | $0.5 \times 10^{-3} - 1 \times 10^{-1}$ | $1.3 \times 10^{-3} - 1 \times 10^{-1}$ |
| Yb type | $0.6 \times 10^{3} - 2 \times 10^{1}$ | $1.1 \times 10^{-3} - 2 \times 10^{-1}$ |

According to another preferred embodiment, the physical vapor deposition is performed by high-frequency sputtering technique (RF sputtering). The high-frequency power is less than 115 W/cm$^2$, preferably less than 15 W/cm$^{-2}$. In the case of RF sputtering, the speed or rate of deposition increases with increase of the high-frequency power. However, if the high-frequency power exceeds 115 W/cm$^2$, arc discharge or abnormal discharge is apt to occur. Therefore, high-frequency power which is less than 115 W/cm$^{-2}$, preferably less than 15 W/cm$^2$ was used in the present invention.

According to a further preferred embodiment, the distance between the substrate and the target is adjusted to a value selected from the range of 3 to 300 mm, preferably 15 to 300 mm. When the distance is too small, it is difficult to produce plasma between the substrate and the target. Particularly, in case of the high-frequency magnetron sputtering technique, the plasma is converged or concentrated in the neighborhood of a magnet positioned behind the target, uniform deposition of the thin film cannot be obtained if the distance between the substrate and the target is too small. Therefore, the distance must be larger than the predetermined minimum value. To the contrary, when the distance between the substrate and the target is too large, the deposition rate become too slow to effect practical deposition. Therefore, the distance is preferably adjusted from 3 mm to 300 mm, preferably from 15 mm to 300 mm.

The high-frequency power and the distance between the substrate and the target can be selected from the following ranges for respective systems:

| Element "M" | The high frequency power and the distance between the substrate and the target | | |
|---|---|---|---|
| | High-frequency power (W/cm2) | Distance (mm) | |
| | | General range | Preferable range |
| Y type | $\leq 95$ | 4–230 | 15–230 |
| La type | $\leq 100$ | 3–300 | 15–300 |
| Gd type | $\leq 103$ | 3–225 | 16–225 |
| Ho type | $\leq 104$ | 5–215 | 15–215 |
| Er type | $\leq 103$ | 4–210 | 16–210 |
| Yb type | $\leq 98$ | 4–221 | 16–220 |

According to a preferred embodiment, the thin film obtained by the abovementioned physical vapor deposition may additionally be heat-treated or annealed in order to reduce the difference between the onset temperature where superconductivity starts to be observed and the critical temperature where resistance becomes zero. This heat-treatment can be carried out at a temperature ranging from 250° C. to 1,700° C., preferably from 250° C. to 1,200° C., for 0.2 to 7 hours. Through this heat-treatment of the substrate, the thin film is subjected to the same effect as sintering, so that the film is changed to the proper perovskite type oxide or quasi-perovskite type oxide. However, if the temperature of this heat-treatment is too high, it is difficult to control the composition of the deposited film and hence the proper perovskite type oxide or quasi-perovskite type oxide cannot be obtained.

The heat-treatment permits improvement of the critical temperature (Tc) of the superconducting thin film prepared according to the present invention and also reduces the difference between the onset temperature where superconductivity starts to be observed and the critical temperature where resistance becomes zero. Thus, the atomic ratio of oxygen in the deposited thin film can be controlled or adjusted by this heat-treatment in order to improve the superconducting property of the deposited film.

As described above, an object of the heat-treatment is to homogenize the composition of the deposited thin film and to obtain the proper perovskite type oxide or quasi-perovskite type oxide. If the temperature of the heat-treatment is not higher than 250° C., it is difficult to obtain the desired perovskite type oxide or quasi-perovskite type oxide which possess the desired critical temperature of superconductivity or it takes an extremely long time to complete the heat-treatment. To the contrary, if the temperature of the heat-treatment exceeds 1,700° C., the amount of, desired perovskite type oxide or quasi-perovskite type oxide is too reduced or disappeared, resulting in lowering of the critical temperature. In practice, the temperature of the heat-treatment is preferably selected in the following ranges for respective types of "M":

| Element "M" | Temperature of heat-treatment (°C.) | |
|---|---|---|
| | General range | Preferable range |
| Y type | 270–1,450 | 270–1,090 |
| La type | 280–1,480 | 280–1,100 |
| Gd type | 380–1,700 | 380–1,200 |
| Ho type | 250–1,650 | 250–1,150 |
| Er type | 260–1,700 | 260–1,200 |
| Yb type | 250–1,650 | 250–1,100 |

The thin film obtained according to the present invention has the formula:

$Ba_pM_qCu_rO_x$ wherein "M" represents one element selected from a group consisting of Y, La, Gd, Ho, Er, and Yb and "p", "q", "r", and "x" represent numbers which correspond to atomic ratio of the elements Ba, M, Cu, and O.

Particularly, the thin film is considered one of the following compound oxides or their mixture:

(Ba, M)$_2$CuO$_{4-x}$ ("x" is a number such that $1 \leq x$)

(Ba, M)CuO$_{3-x}$ ("x" is a number such that $1 \leq x$) or (Ba, M)$_3$Cu$_2$O$_{7-*}$ ("*" is a number such that $1 \leq *$)

The thin films obtained according to the present invention can be also considered to have the following compositions or their mixture:

| | |
|---|---|
| Y type | $Ba_{0.6}Y_{0.4}CuO_3$ or $BaY_{0.3}Cu_{0.7}O_3$ |
| La type | $Ba_{0.6}La_{0.4}CuO_3$ or $BaLa_{0.3}Cu_{0.7}O_3$ |
| Gd type | $Ba_{0.6}Gd_{0.4}CuO_3$ or $BaGd_{0.3}Cu_{0.7}O_3$ |
| Ho type | $Ho_{0.6}Ba_{0.4}CuO_3$ or $HoBa_{0.3}Cu_{0.7}O_3$ |
| Er type | $Er_{0.6}Ba_{0.4}CuO_3$ or $ErBa_{0.3}Cu_{0.7}O_3$ |
| Yb type | $Yb_{0.6}Ba_{0.4}CuO_3$ or $YbBa_{0.3}Cu_{0.7}O_3$ |

As mentioned above, the target used in the present invention may be a preliminary sintered mass which is obtained by sintering a powder mixture of an oxide, carbonate, nitrate or sulfate of Ba; an oxide, carbonate, nitrate or sulfate of one element M selected from a group consisting of Y, La, Gd, Ho, Er, and Yb; and an oxide, carbonate, nitrate or sulfate of Cu, or a finally sintered mass which is obtained by further sintering the abovementioned preliminary sintered material or mass. It is also possible to use, as the target, a powder which is obtained by pulverizing the abovementioned preliminary sintered mass or finally sintered mass and a sintered block which is prepared by press-molding the abovementioned powder.

When the abovementioned powder of the sintered mass is used as the target, the efficiency of evaporation can be improved and hence higher deposition rate is achieved. The particle size of the powder is preferably selected in a range of from 0.02 to 3 mm, more particularly, can be selected from the following ranges for respective systems or types of element "M":

| Particle size of sintered powder | |
|---|---|
| Element "M" | Particle size (mm) |
| Y type | 0.06–3 |
| La type | 0.06–3 |
| Gd type | 0.02–2 |
| Ho type | 0.03–2 |
| Er type | 0.03–2 |
| Yb type | 0.04–2 |

The target according to the present invention can be also used in the ion plating technique in which an ion beam from an electron gun is directed onto the target.

In fact, adjustment of components which are indispensable to obtain the proper superconducting thin film is facilitated because material of the target is made of sintered mass or powder, and hence it is not scattered by sputtering gas or the ion beam.

It is apparent from the previous description that the process according to the present invention permit production of a superconducting thin film made of compound oxido having higher Tc than conventional superconducting thin films and hence the superconducting thin films obtained according to the present invention can be utilized advantageously in thin film device applications, such as Matisoo switching elements or Josephson device, Anacker memory devices or SQUIDS (Superconducting Quantum Interference Device).

Now, apparatus which can be used to realize the abovementioned process according to the present invention will be described with reference to the attached drawings which are not limitative of the present invention.

BRIEF DESCRIPTION OF THE DRAWINGS

FIG. 1 shows a sputtering machine which is used for carrying out the process according to the present invention and includes a vacuum chamber or bell jar 1, a target material target 2 placed in the vacuum chamber 1, a high-frequency power source 3 connected to the target 2, and a substrate 4 facing the target 2 on which the thin film is deposited. A vacuum pump (not shown) connected through a port 7 to the interior of the chamber 1 functions to create vacuum therein.

Figure 1:
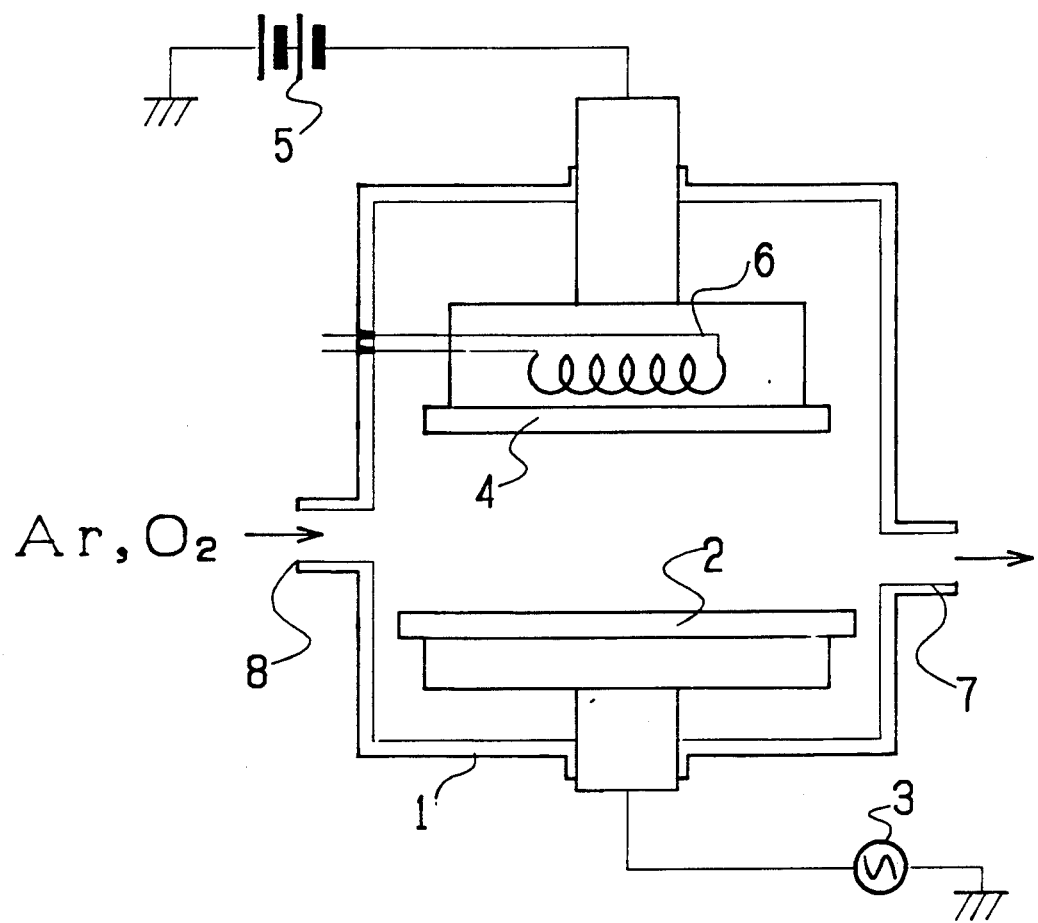
FIG. 1 illustrates an example of a sputtering device which can be used to carry out the process of the present invention.

Bias voltage is impressed on the substrate 4 from a source of high-voltage 5. The substrate 4 is heated by a heater 6 so that the temperature of the substrate is adjustable. The bell jar 1 has a gas inlet 8 for introducing argon and/or oxygen gas.

Figure 2:
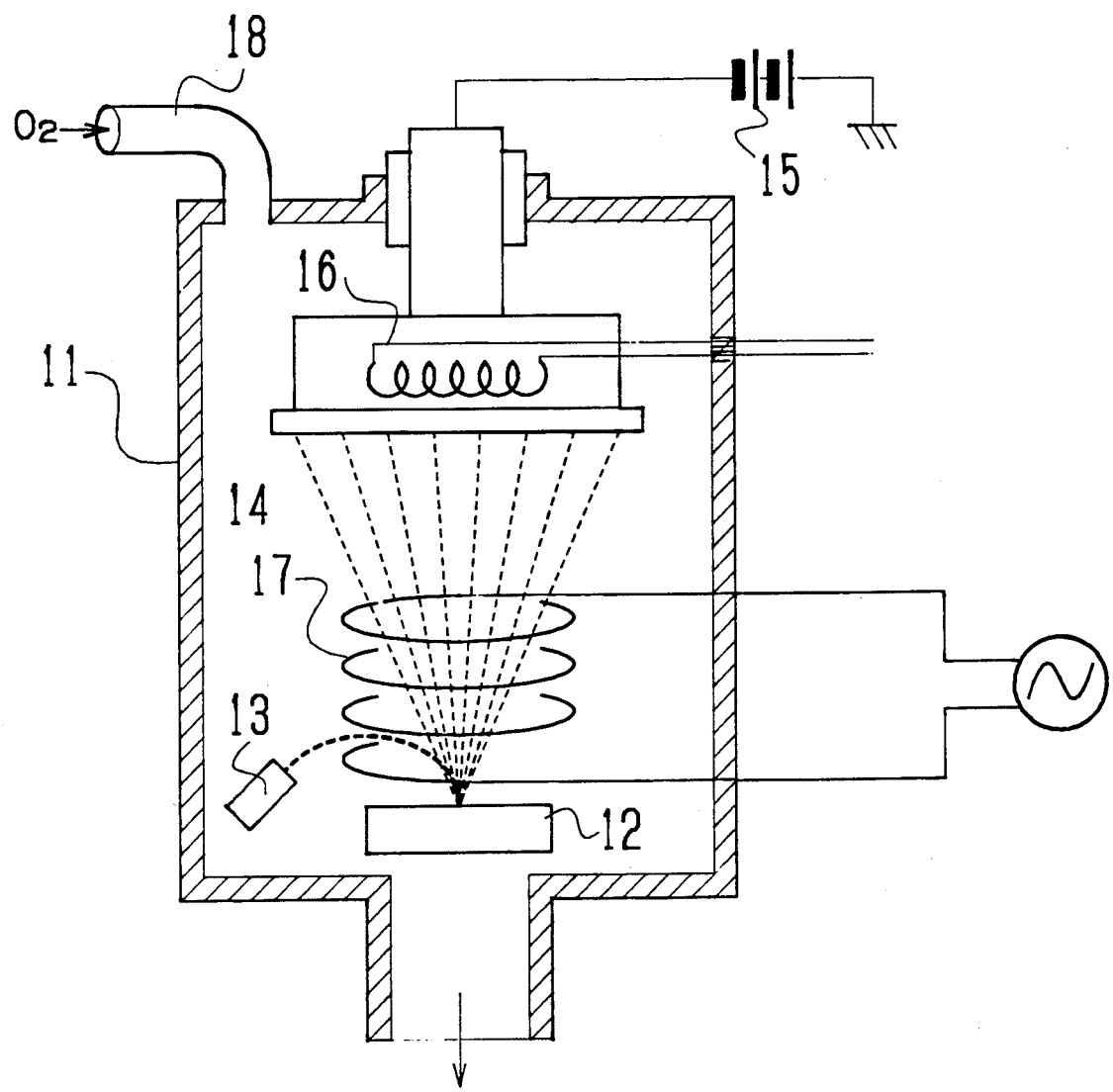
FIG. 2 shows an illustrative cross section of an embodiment of an ion plating device which can be used in the process according to the present invention.

FIG. 2 shows an ion plating machine which can be used for carrying out the process according to the present invention and includes a vacuum chamber or bell jar 11, a target material 12 placed in the vacuum chamber 11, an electron gun 13 placed in the neighborhood of the target 12 for melting and evaporating material of the target 12, and a substrate 14 facing the target 12 on which the thin film is deposited. A vacuum pump (not shown) connected to the interior of the chamber 11 functions to create vacuum therein.

Bias voltage is impressed on the substrate 14 from a source of high-voltage 15. The substrate 14 is heated by a heater 16 so that the temperature of the substrate is adjustable. A high-frequency coil 17 is arranged in the bell jar 11 between the target 12 and the substrate 14 in such manner that evaporated particles are enclosed by the coil. The bell jar 11 has a gas inlet 18 for introducing oxygen gas.

Now, embodiments of the process according to the present invention will be described with reference to illustrative Examples, but the scope of the present invention should not be limited thereto.

EXAMPLE 1

A superconducting thin film was produced in a sputtering device illustrated in FIG. 1.

At first, powders of BaCO$_3$, Y$_2$(CO$_3$)$_3$, and CuO are mixed uniformly in such proportions that the atomic ratio of Ba/(Ba+Y) is 0.4 and the atomic ratio of Ba/Cu is ⅔, and then compacted. Then, the resulting compacted powder mixture is subjected to a preliminary sintering at 820° C. for 12 hours. The resulting preliminary sintered mass is pulverized and then compacted again. The resulting compacted mass is further finally sintered at 1,080° C. to obtain a target of a sintered body. Sputtering is carried out on a substrate of silicon crystal under the following conditions:
Partial pressure of oxygen—$4 \times 10^{-2}$ Torr
Partial pressure of argon—$3 \times 10^{-2}$ Torr
Temperature of the substrate—700° C.
Bias voltage imposed on the substrate——60 V
High-frequency power—25 W/cm$^2$
Distance between substrate and target—40 mm A film of about 1 micron thick is obtained at a deposition rate of 3 Angstroms/sec. For comparison, the same operation as above is repeated but no oxygen is introduced in the chamber.

To determine the electric resistance of the resulting thin film, a pair of electrodes of aluminum are vacuum-deposited on a surface of the thin film at opposite ends of the surface and a pair of lead wires are soldered to the deposited aluminum electrodes.

The result was that the thin film prepared under the partial pressure of oxygen of $4 \times 10^{-2}$ Torr according to the present invention showed an onset temperature (from which the superconducting phenomenon started to appear) of 98 K and a critical temperature (at which complete superconductivity is obtained) of 94 K. On the other hand, in the comparative example in which a thin film is prepared without introducing oxygen, although the resulting thin film showed almost the same onset temperature, the electric resistance dropped rather gradually before it became zero at about 9 K. This fact revealed that introduction of oxygen into the chamber for controlling oxygen content in the thin film during the film formation was critical to obtain a desired superconducting thin film.

EXAMPLE 2

In this Example, a powder prepared from the finally sintered body is used as a target. Namely, the finally sintered body obtained in Example 1 is pulverized to prepare a powder having an average particle size of 0.3 mm and sputtering is repeated under the same operating conditions as Example 1 to obtain a superconducting thin film.

In this Example, a higher deposition rate of 14 Angstroms/sec. than Example 1 is achieved.

The thin film prepared in this Example 2 using a target composed of a sintered power showed an onset temperature (at which the superconducting phenomenon started to appear) of about 97 K and a critical temperature (at which complete superconductivity is obtained) of 92 K.

This fact revealed that the efficiency of film formation can be improved without substantially degrading the properties of a superconducting thin film.

EXAMPLE 3

The same operation as Example 1 is repeated except that proportions of material powders are changed and a preliminary sintered mass is used as a target. Namely, powders of $BaCO_3$, $Y_2(CO_3)_3$, and CuO are mixed in such proportions that the atomic ratio of Ba:Y:Cu becomes 0.9:0.25:1 and then, the mixture is compacted and preliminary sintered at 400° C. for 12 hours.

A thin film obtained by using a target of the above-mentioned preliminary sintered mass showed an onset temperature of about 95 K.

This fact revealed that a superconducting thin film can be produced when a preliminary sintered oxide is used as a target.

EXAMPLE 4

The thin film obtained in Example 1 is annealed at 550° C. for 20 minutes under an atmosphere of oxygen partial pressure of $0.9 \times 10^{-1}$ Torr.

The superconducting transition temperatures of the resulting annealed thin film were measured by the same method as Example 1. The result showed that electric resistance dropped much sharply than the case of Example 1 and the difference between the onset temperature and the critical temperature was 2 K.

EXAMPLE 5

The same operation as Example 1 is repeated except that the final sintering temperature is changed to 920° C., the high-frequency power is changed to 2.0 W/cm$^2$ and a substrate of magnesia (MgO) is used.

The onset temperature and the critical temperature of the resulting thin film measured by the same method as Example 1 were 98K and 95K, respectively.

EXAMPLE 6

A superconducting thin film was produced in a sputtering machine illustrated in FIG. 1.

At first, powders of $BaCO_3$, $La_2(CO_3)_3$, and CuO are mixed uniformly in such proportions that the atomic ratio of Ba/(Ba+La) is 0.2 and the atomic ratio of Ba/Cu is ⅔, and then compacted. Then, the resulting compacted powder mixture is subjected to a preliminary sintering at 810° C. for 12 hours. The resulting preliminary sintered mass is pulverized and then compacted again. The resulting compacted mass is further finally sintered at 1,070° C. to obtain a target of a sintered body. Sputtering is carried out on a substrate of silicon crystal under the following conditions:
Partial pressure of oxygen—$1 \times 10^{-2}$ Torr
Partial pressure of argon—$1 \times 10^{-2}$ Torr
Temperature of the substrate—600° C.
Bias voltage imposed on the substrate——150 V
High-frequency power—20 W/cm$^{-2}$
Distance between substrate and target—50 mm A film of about 1 micron thick is obtained at a deposition rate of 5 Angstroms/sec. For comparison, the same operation as above is repeated but no oxygen is introduced in the chamber.

To determine the electric resistance of the resulting thin film, a pair of electrodes of aluminum are vacuum-deposited on a surface of the thin film at opposite ends of the surface and a pair of lead wires are soldered to the deposited aluminum electrodes.

The result was that the thin film prepared under the partial pressure of oxygen of $1 \times 10^{-2}$ Torr according to the present invention showed an onset temperature (at which superconducting phenomenon started to appear) of about 60K and a critical temperature (at which complete superconductivity is obtained) of 51 K. On the other hand, in the comparative example in which a thin film is prepared without introducing oxygen, although the resulting thin film showed almost same onset temperature, the electric resistance dropped rather gradually before it became zero at about 4 K. This fact revealed that introduction of oxygen into the chamber for controlling the oxygen content of the thin film during the film formation was critical to obtain a desired superconducting thin film.

EXAMPLE 7

In this Example, a powder prepared from the finally sintered body is used as a target. Namely, the finally sintered body obtained in Example 6 is pulverized to prepare a powder having a average particle size of 0.2 mm and sputtering is repeated under the same operating conditions as Example 1 to obtain a superconducting thin film.

In this Example, a higher deposition rate (9 Angstroms/sec.) than Example 6 is achieved.

The thin film prepared in this Example 7 using a target composed of a sintered power showed an onset temperature (at which superconducting phenomenon started to appear) of about 55K and a critical temperature (at which the complete superconductivity is obtained) of 49K.

This fact revealed that the efficiency of film formation can be improved without substantially degrading the properties of a superconducting thin film.

EXAMPLE 8

The same operation as Example 6 is repeated except that the proportions of material powders are changed and a preliminary sintered mass is used as a target. Namely, powders of $BaCO_3$, $La_2(CO_3)_3$, and CuO are mixed in such proportions that the atomic ratio of Ba:-La:Cu becomes 0.7:0.85:1 and then, the mixture is compacted and preliminary sintered at 400° C. for 12 hours.

A thin film obtained by using a target of the above-mentioned preliminary sintered mass showed an onset temperature of about 58 K.

This fact revealed that a superconducting thin film can be produced when a preliminary sintered oxide is used as a target.

EXAMPLE 9

The thin film obtained in Example 6 is annealed at 610° C. for 20 minutes under an atmosphere of oxygen partial pressure of $1.3 \times 10^{-1}$ Torr.

The superconducting transition temperatures of the resulting annealed thin film were measured by the same method as Example 6. The result showed that electric resistance dropped much sharply than the case of Example 6 and the difference between the onset temperature and the critical temperature was 1 K.

EXAMPLE 10

The same operation as Example 6 is repeated except that the final sintering temperature is changed to 930° C., the high-frequency power is changed to 1.8 $W/cm^{-2}$ and a substrate of magnesia (MgO) is used.

The onset temperature and the critical temperature of the resulting thin film measured by the same method as Example 1 were 62 K and 53 K, respectively.

EXAMPLE 11

A superconducting thin film was produced in a sputtering machine illustrated in FIG. 1.

At first, powders of $BaCO_3$, $Ho_2(CO_3)_3$, and CuO were mixed uniformly in such proportions that the atomic ratio of Ba/(Ba+Ho) was 0.55 and the atomic ratio of Ba/Cu was ⅔, and then compacted. Then, the resulting compacted powder mixture was subjected to a preliminary sintering at 830° C. for 12 hours. The resulting preliminary sintered mass was pulverized and then compacted again. The resulting compacted mass was further sintered finally at 1,000° C. to obtain a target of a sintered body. Sputtering was carried out on a substrate of silicon crystal under the following conditions:

Partial pressure of oxygen—$1 \times 10^{-2}$ Torr
Partial pressure of argon—$2 \times 10^{-2}$ Torr
Temperature of the substrate—890° C.
Bias voltage imposed on the substrate—35 V
High-frequency power—8 $W/cm^2$
Distance between substrate and target—20 mm A film of about 1 micron thickness was obtained at a deposition rate of 2 Angstroms/sec. For comparison, the same operation as above is repeated but no oxygen was introduced in the chamber.

To determine electric resistance of the resulting thin film, a pair of electrodes of aluminum were vacuum-deposited on a surface of the thin film at opposite ends of the surface and a pair of lead wires were soldered to the deposited aluminum electrodes.

The result was that the thin film prepared under the partial pressure of oxygen of $1 \times 10^{-2}$ Torr according to the present invention showed an onset temperature (at which superconducting phenomenon started to appear) of 106 K and a critical temperature (at which the complete superconductivity is obtained) of 100 K. On the other hand, in the comparative example in which a thin film was prepared without introducing oxygen, although the resulting thin film showed almost same onset temperature, the electric resistance dropped rather gradually before it became zero at about 8 K. This fact revealed that introduction of oxygen into the chamber for controlling oxygen content of the thin film during the film formation was critical to obtain a desired superconducting thin film.

EXAMPLE 12

In this Example, a powder prepared from the finally sintered body is used as a target. Namely, the finally sintered body obtained in Example 11 is pulverized to prepare a powder having an average particle size of 0.2 mm and sputtering is repeated under the same operating conditions as Example 11 to obtain a superconducting thin film.

In this Example, a higher deposition rate of 4 Angstroms/sec. than Example 11 is achieved.

The thin film prepared in this Example 12 using a target composed of a sintered power showed an onset temperature (at which superconducting phenomenon started to appear) of about 105K and a critical temperature (at which the complete superconductivity is obtained) of 98K.

This fact revealed that the efficiency of film formation can be improved without substantially degrading the properties of a superconducting thin film substantially.

EXAMPLE 13

The same operation as Example 11 is repeated except that the proportions of the material powders are changed and a preliminary sintered mass is used as a target. Namely, powders of $BaCO_3$, $Ho_2(CO_3)_3$, and CuO are mixed in such proportions that the atomic ratio of Ba:Ho:Cu becomes 0.9:0.85:1 and then, the mixture is compacted and sintered preliminarily at 400° C. for 12 hours.

A thin film obtained by using a target of the above-mentioned preliminary sintered mass showed an onset temperature of about 103 K.

This fact revealed that a superconducting thin film can be produced when a preliminary sintered oxide is used as a target.

EXAMPLE 14

The thin film obtained in Example 11 is annealed at 780° C. for 20 minutes under an atmosphere of oxygen partial pressure of $1.1 \times 10^{-1}$ Torr.

The superconducting transition temperatures of the resulting annealed thin film were measured by the same method as Example 11. The result showed that electric resistance dropped much sharply than the case of Example 1 and the difference between the onset temperature and the critical temperature was 3 K.

EXAMPLE 15

The same operation as Example 11 is repeated except that the final sintering temperature is changed to 940° C., the high-frequency power is changed to 3.3 W/cm$^2$ and a substrate of magnesia (MgO) is used.

The onset temperature and the critical temperature of the resulting thin film measured by the same method as Example 1 were 107 K and 102 K, respectively.

EXAMPLE 16 to 18

The same operation as Example 1 is repeated except that $Y_2(CO_3)_3$ in the material powder is changed to $Gd_2(CO_3)_3$ (Example 16), $Er_2(CO_3)_3$ (Example 17), and $Yb_2(CO_3)_3$ (Example 18), respectively, and that the conditions of sputtering operation are changed or modified to the values shown in Table 1.

The onset temperature (Tci) (at which superconducting phenomenon started to appear) and the critical temperature (Tcf) (at which complete superconductivity is obtained) of the resulting thin film measured by the same method as Example 1 are also summarized in Table 1.

TABLE 1

| | Example | | |
|---|---|---|---|
| | 16 | 17 | 18 |
| Element "M" | Gd | Er | Yb |
| Atom ratio Ba/(Ba + M) | 0.6 | 0.4 | 0.55 |
| Atom ratio Ba/Cu | ⅔ | ⅔ | ⅔ |
| Preliminary sintering Temperature (°C.) | 810 | 840 | 850 |
| Duration of Preliminary sintering (hr) | 12 | 12 | 12 |
| Final sintering Temperature (°C.) | 1,000 | 1,040 | 1,050 |
| Substrate | Si | Si | Si |
| Partial pressure of oxygen ($10^{-2}$ Torr) | 1 | 1 | 1 |
| Partial pressure of argon ($10^{-2}$ Torr) | 1 | 3 | 3 |
| Temperature of the substrate (°C.) | 880 | 910 | 890 |
| Bias voltage imposed on the substrate (V) | −90 | −50 | −70 |
| High-frequency power (W/cm$^2$) | 5 | 12 | 30 |
| Distance between substrate and target (mm) | 70 | 50 | 40 |
| Deposition rate (Angstrom/sec.) | 4 | 3 | 3 |
| Film thickness (micron) | 1 | 1 | 1 |
| Onset temperature (Tci) (K) | 108 | 98 | 95 |

TABLE 1-continued

| | Example | | |
|---|---|---|---|
| | 16 | 17 | 18 |
| Critical temp. (Tcf) (K) | 101 | 92 | 85 |

EXAMPLE 19 to 21

In these Examples 19 to 21, powders prepared from the finally sintered body are used as the respective target. Namely, the finally sintered bodies obtained in Example 16 to 18 are pulverized to prepare powders having average particle sizes shown in Table 2 and sputtering operations are repeated under the same operating conditions as Example 16 to 18 except that deposition rates are improved, as are shown in Table 2.

The onset temperature (Tc) and the critical temperature (Tcf) at which complete superconductivity is obtained of the resulting thin films measured by the same method as Example 1 are also summarized in Table 2.

TABLE 2

| | Example | | |
|---|---|---|---|
| | 19 | 20 | 21 |
| Element "M" | Gd | Er | Yb |
| Average particle size (mm) | 0.2 | 0.3 | 0.3 |
| Deposition rate (Angstrom/sec.) | 9 | 5 | 10 |
| Onset temperature (Tci) (K) | 106 | 96 | 94 |
| Critical temp. (Tcf) (K) | 99 | 91 | 85 |

EXAMPLE 22 to 24

The same operations as in Examples 16 to 18 are respectively repeated except that proportions of material powders are changed and targets are changed to preliminary sintered masses. Namely, powders of $BaCO_3$; $Gd_2(CO_3)_3$, $Er_2(CO_3)_3$ or $Yb_2(CO_3)_3$; and CuO are mixed in such proportions that the atomic ratio of Ba:[Gd, Er or Yb]:Cu becomes the respective values shown in Table 3 and then each resulting mixture is compacted and preliminary sintered at 400° C. for 12 hours.

The onset temperature (Tci) of the resulting thin films measured by the same method as Example 1 are also summarized in Table 3.

TABLE 3

| | Example | | |
|---|---|---|---|
| | 22 | 23 | 24 |
| Element "M" | Gd | Er | Yb |
| Composition of target (atom ratio) | | | |
| Ba | 0.7 | 0.9 | 0.85 |
| Gd | 0.85 | | |
| Er | | 0.85 | |
| Yb | | | 0.75 |
| Cu | 1.0 | 1.0 | 1.0 |
| Onset temperature (Tci) (K) | 105 | 95 | 92 |

EXAMPLE 25 to 27

Each of the thin films obtained in Example 16 to 18 is annealed at a temperature shown in Table 4 for 20 minutes under an oxygen atmosphere of the partial oxygen pressure shown in the Table 4.

The superconducting transition temperatures of the resulting annealed thin films were measured by the same method as Example 16. The result showed that electric resistance dropped much sharply than the case of Example 16 to 18 and the differences between the onset temperature and the critical temperature of respective thin films improved as shown in Table 4.

TABLE 4

|  | Example | | |
|---|---|---|---|
|  | 25 | 26 | 27 |
| Element "M" in targets | Gd | Er | Yb |
| Partial pressure of oxygen ($\times 10^{-1}$ Torr) | 1.2 | 0.9 | 1.1 |
| Annealing Temperature (°C.) | 770 | 710 | 680 |
| Duration of annealing (hr) | 20 | 20 | 20 |
| (Tci) − (Tcf) (K) | 4 | 4 | 83 |

EXAMPLE 28 TO 30

The same operations as Examples 16 to 18 are repeated except that the final sintering temperature, and the high-frequency power are changed to values shown in Table 5 and a substrate of magnesia (MgO) is used for all Examples 28 to 30.

The onset temperatures of the resulting thin films measured by the same method as Example 1 are also shown in Table 5.

TABLE 5

|  | Example | | |
|---|---|---|---|
|  | 28 | 29 | 30 |
| Element "M" in targets | Gd | Er | Yb |
| Final sintering temperature (°C.) | 960 | 980 | 990 |
| High-frequency power (W/cm²) | 5 | 3 | 10 |
| (Tci) (K) | 109 | 99 | 96 |

EXAMPLE 31

A superconducting thin film was produced in a sputtering device as illustrated in FIG. 1. Powders of $Y_2O_3$, BaO and CuO were mixed uniformly in such proportions that the atomic ratios of Y:Ba:Cu became 1:2:3, and the powders were then compacted. The resulting compacted powder mixture was subjected to a preliminary sintering at 820° C. for 12 hours. The resulting preliminarily sintered mass was pulverized and then compacted again. The resulting compacted mass was further finally sintered at 1,080° C. to obtain a target of a sintered body. Sputtering was carried out on a substrate of MgO single crystal under the following conditions:
partial pressure of oxygen—$4 \times 10^{-2}$ torr
partial pressure of argon—$3 \times 10^{-2}$ torr
substrate temperature—450° C.
high-frequency power—0.6 W/cm2
substrate to target distance—40 mm A film having a thickness of about 5,000 Å was obtained. The onset temperature and the critical temperature were determined by the same method as in Example 1 and were as follows:
Tc (onset)—90 K
Tc (zero resistance)—85 K.

What we claim are:

1. A process for producing a superconducting thin film on a substrate, comprising the steps of:
providing a substrate, and
depositing a superconducting thin film on the substrate by high-frequency sputtering by using a target made of a compound oxide containing Ba; one element M selected from the group consisting of Y, La, Gd, Ho, Er, and Yb; and Cu wherein the substrate is heated at a temperature in the range of 450° C. to 1,000° C. during the sputtering.

2. A process as claimed in claim 1, wherein said target contains perovskite type oxide or quasi-perovskite type oxide.

3. A process as claimed in claim 1 or 2, wherein said target is a preliminary sintered mass which is obtained by sintering a powder mixture of an oxide, carbonate, nitrate, or sulfate of Ba; an oxide, carbonate, nitrate, or sulfate of one element M selected from the group consisting of Y, La, Gd, Ho, Er, and Yb; and an oxide, carbonate, nitrate, or sulfate of Cu, at a temperature ranging from 250° to 1,200° C.

4. A process as claimed in claim 1, wherein target is a finally sintered mass which is obtained by final sintering of a preliminary sintered mass which is obtained by preliminary sintering a powder mixture of an oxide, carbonate, nitrate, or sulfate of Ba; an oxide, carbonate, nitrate, or sulfate of one element M selected from the group consisting of Y, La, Gd, Ho, Er, and Yb; and an oxide, carbonate, nitrate, or sulfate of Cu, said final sintering being carried out at a temperature ranging from 700° to 1,500° C.

5. A process as claimed in claim 4, wherein said target is in a form of sintered powder material obtained from a preliminary sintered mass or a finally sintered mass.

6. A process as claimed in claim 5, wherein said target is in a form of sintered block obtained from said preliminary sintered mass or said finally sintered mass.

7. A process as claimed in claim 4, wherein said final sintering is carried out at a temperature from 700° to 1,300° C.

8. A process as claimed in claim 1, wherein said target is composed of a plurality of target segments.

9. A process as claimed in claim 8, wherein each of said target segments is composed of an oxide of Ba, an oxide of one element M selected from the group consisting of Y, La, Gd, Ho, Er, and Yb, and an oxide of Cu.

10. A process as claimed in claim 8, wherein said target is composed of two target segments each consisting of (Ba, M)$O_x$ and CuO, and x represents a number such that $1 \leq x$.

11. A process as claimed in claim 1, wherein the atomic ratio of Ba/(Ba+M) is within the range of from 0.04 to 0.97.

12. A process as claimed in claim 1, wherein the atomic ratio of Ba/(Ba+M) is within the range of from 0.1 to 0.7.

13. A process as claimed in claim 1, wherein the atomic ratio of Ba, M and Cu in said target is adjusted as a function of the evaporation rates of Ba, M and Cu on the basis of the atomic ratio of Ba, M and Cu in the thin film to be produced.

14. A process as claimed in claim 1, wherein Ar and $O_2$ are contained in a vaporization atmosphere, a partial pressure of Ar ranging from $1.0 \times 10^{-3}$ to $1 \times 10^{-1}$ Torr.

15. A process as claimed in claim 14, wherein $O_2$ in the vaporization atmosphere has a partial pressure ranging from $0.5 \times 10^{-3}$ to $1 \times 10^{-1}$ Torr.

16. A process as claimed in claim 15, wherein the partial pressure of oxygen is $1.0 \times 10^{-3}$ to $1 \times 10^{-1}$ Torr.

17. A process as claimed in claim 14, wherein the partial pressure of Ar is $5.0 \times 10^{-3}$ to $1 \times 10^{-1}$ Torr.

18. A process as claimed in claim 1, wherein the power of the high-frequency sputtering less than 115 W/cm².

19. A process as claimed in claim 18, wherein said sputtering is magnetron sputtering.

20. A process as claimed in claim 18, wherein the power of the high-frequency is less than 15 W/cm$^{-2}$.

21. A process as claimed in claim 1, wherein the obtained thin film is heat-treated.

22. A process as claimed in claim 21, wherein said heat-treatment is carried out at a temperature ranging from 250° C. to 1,700° C.

23. A process as claimed in claim 22, wherein the heat-treatment temperature ranges from 250° C. to 1,200° C.

24. A process as claimed in claim 21 wherein said heat-treatment is carried out under a partial pressure of O₂ which is not less than $0.5 \times 10^{-1}$ Torr.

25. A process as claimed in claim 1, wherein the substrate is heated by a heater during the sputtering operation.

26. A process as claimed in claim 1, wherein said substrate is made of a material selected from the group consisting of glass, quartz, silicon, stainless steel, and ceramics.

27. A process as claimed in claim 1, wherein the distance between said substrate and said target is adjusted at a value of from 3 to 300 mm.

28. A process as claimed in claim 27, wherein said target is adjusted at the value from 15 to 300 mm.

29. A process as claimed in claim 1, wherein the substrate is heated at a temperature in the range of at least 690° C. to 1000° C. during the sputtering.

30. A process as claimed in claim 1, wherein said high-frequency sputtering is performed at a power of less than 115 W/cm².

31. A process as claimed in claim 1, wherein said high-frequency sputtering is performed at a power of less than 15 W/cm².

32. A process as claimed in claim 1, wherein said substrate temperature is between 500° and 960° C.

33. A process for producing a superconducting thin film on a substrate, comprising the steps of:
providing a target composed of (1) a preliminary sintered mass which is obtained by sintering a powder mixture of an oxide, carbonate, nitrate, or sulfate of Ba, an oxide, carbonate, nitrate, or sulfate of one element M selected from the group consisting of Y, La, Gd, Ho, Er, and Yb; and an oxide, carbonate, nitrate, or sulfate of Cu, at a temperature ranging from 250° to 1,200° C., or (2) a finally sintered mass which is obtained by final sintering of said preliminary sintered mass at a temperature ranging from 700° to 1,500° C.;
providing a substrate;
depositing a superconducting thin film on the substrate by high-frequency sputtering of the target, wherein the substrate is heated at a temperature in the range of 450° C. to 1,000° C. during the sputtering.

34. A process as claimed in claim 33, wherein the atomic ratio of Ba/(Ba+M) is selected in a range of from 0.04 to 0.97.

35. A process as claimed in claim 33, wherein Ar and O₂ are contained in the vaporization, a partial pressure of Ar ranging from $1.0 \times 10^{-3}$ to $1 \times 10^{-1}$ Torr.

36. A process as claimed in claim 35, wherein O₂ in the vaporization atmosphere has a partial pressure ranging from $0.5 \times 10^{-3}$ to $1 \times 10^{-1}$ Torr.

37. A process as claimed in claim 36, wherein the partial pressure of oxygen ranges from $1.0 \times 10^{-3}$ to $1 \times 10^{-1}$ Torr.

38. A process as claimed in claim 35, wherein the partial pressure of Ar ranges from $5.0 \times 10^{-3}$ to $1 \times 10^{-1}$ Torr.

39. A process as claimed in claim 33, wherein said high-frequency sputtering is performed at a power of less than 115 W/cm².

40. A process as claimed in claim 39, wherein said sputtering is magnetron sputtering.

41. A process as claimed in claim 39, wherein the power of the high-frequency sputtering is less than 15 W/cm$^{-2}$.

42. A process as claimed in claim 33, wherein the obtained thin film is heat-treated.

43. A process as claimed in claim 42, wherein said heat-treatment is carried out at a temperature ranging from 250° C. to 1,700° C.

44. A process as claimed in claim 43, wherein the heat-treatment temperature ranges from 250° C. to 1,200° C.

45. A process as claimed in claim 42, wherein said heat-treatment is carried out under a partial pressure of O₂ which is not less than $0.5 \times 10^{-1}$ Torr.

46. A process as claimed in claim 33, wherein the finally sintered mass is obtained by sintering said preliminary sintered mass at a temperature from 700° to 1,300° C.

47. A process as claimed in claim 33, wherein the substrate is heated at a temperature in the range of at least 690° C. to 1000° C. during the sputtering.

48. A process as claimed in claim 33, wherein said high-frequency sputtering is performed at a power of less than 15 W/cm².

49. A process as claimed in claim 33, wherein said substrate temperature is between 500° and 960° C.

* * * * *